(12) United States Patent
Leahy et al.

(10) Patent No.: US 6,703,697 B2
(45) Date of Patent: Mar. 9, 2004

(54) ELECTRONIC PACKAGE DESIGN WITH IMPROVED POWER DELIVERY PERFORMANCE

(75) Inventors: Anne Leahy, Tempe, AZ (US); Ajit Sathe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/013,641

(22) Filed: Dec. 7, 2001

(65) Prior Publication Data

US 2003/0110452 A1 Jun. 12, 2003

(51) Int. Cl.⁷ .......................... G06F 17/50; H01L 23/02
(52) U.S. Cl. ...................... 257/678; 438/106; 438/108; 438/109; 438/455; 428/601; 361/760; 716/20; 716/21; 257/686; 257/778; 257/723
(58) Field of Search ................ 716/19–21; 361/707, 361/306.3, 760; 174/260; 428/601; 438/106, 108, 109, 455; 257/723, 778, 678, 686

(56) References Cited

U.S. PATENT DOCUMENTS

| | | | | |
|---|---|---|---|---|
| 5,619,399 A | * | 4/1997 | Mok | 361/707 |
| 5,962,151 A | * | 10/1999 | Paszkiet et al. | 428/601 |
| 6,414,849 B1 | * | 7/2002 | Chiu | 361/760 |
| 6,452,113 B2 | * | 9/2002 | Dibene et al. | 174/260 |
| 6,496,355 B1 | * | 12/2002 | Galvagni et al. | 361/306.3 |

* cited by examiner

*Primary Examiner*—Matthew Smith
*Assistant Examiner*—Thuan Do
(74) *Attorney, Agent, or Firm*—Blakely, Sokoloff, Taylor & Zafman LLP

(57) ABSTRACT

An electronic package with improved power delivery performance, lowering the impedance associated with the power delivery. The electronic package includes an integrated circuit die mounted on the substrate of the electronic package and decoupling capacitors placed underneath the substrate. The package further includes stand-offs placed underneath the substrate, sized for maintaining a distance between the capacitors and another substrate.

29 Claims, 16 Drawing Sheets

| Ball Height | Number of Caps | Cap Size | Cap Type | 1st Droop | 2nd Droop | 3rd Droop |
|---|---|---|---|---|---|---|
| 0.7mm | 10 | 0.68 uF | DSC | 169 | 110 | 99 |
| 1.1mm | 10 | 0.68 uF | LSC | 125 | 115 | 103 |
| 1.1mm | 10 | 1.00 uF | LSC | 125 | 95 | 103 |
| 1.1mm | 25 | 1.50 uF | LSC | 97 | 63 | 102 |

FIG. 13A

ELECTRONIC PACKAGE DESIGN WITH IMPROVED POWER DELIVERY PERFORMANCE

FIELD OF THE INVENTION

The present invention relates to electronic package technology, and more particularly to an improved method of power delivery to an electronic package.

BACKGROUND OF THE INVENTION

A typical electronic package assembly includes an integrated circuit (IC) die, which includes a piece of semiconductor material onto which a specific IC has been fabricated, and an electronic package or substrate to which the IC die is mounted. A typical implementation of an electronic package assembly uses surface mount technology. As depicted in FIG. 1, a prior art electronic package 1, which comprises an integrated circuit die 40 and a supporting substrate 50, is shown mounted to a printed circuit board (PCB) 20. In the case of a flip-chip die, i.e., a die with the integrated circuit facing down against the substrate, the die 40 is mounted onto the substrate layer 50 via controlled collapse chip connect bumps (C4 bumps) 41, which additionally provide the electrical connection between the circuits of the die 40 and substrate layer 50. The substrate 50, in turn, is mounted onto the PCB 20 via solder balls 10, which additionally provide the electrical connection between the circuits of the PCB 20 and the substrate 50. A voltage regulator module (VRM) 5 supplies the power to the package assembly 1. Conductive pathways, which are formed by vias 3, plated-through holes 6 (PTH's), and horizontal planes 4, are routed throughout the substrate 50 and the PCB 20, and service to carry current from the VRM 5 to the package assembly 1.

One design aspect of the package assembly 1 includes power delivery. The die 40, like any electrical device, needs a clean power supply and reference voltage for efficient operation. The power delivery aspects of the package design can be characterized by DC voltage and AC noise. The perfect power supply delivers the maximum possible DC voltage with no AC noise. The power delivery path from the VRM 5 to the die 40, however, has an inductance associated with it, creating impedance in the power delivery system. FIG. 2 shows a basic circuit diagram reflecting this impedance $Z_{PowerDelivery}$. During core switching, when a large amount of current $I_{Load}$ is being drawn by the die load $L_{Die}$, such as when running a complex application or first turning a computer on, the current change from the initial draw of current causes a large voltage drop $V_{Die}$ at the die load $L_{Die}$ due to the inductance in the power delivery path.

One known method for mitigating this voltage drop is using decoupling capacitors. These capacitors provide circuit decoupling and supply charge to the die, thus, mitigating the voltage drop and impedance. Several stages of decoupling capacitors are desired to keep the impedance of the power delivery in check. Referring back to FIG. 1, decoupling capacitors 30, which are referred to as die side capacitors (DSC's), are mounted on the substrate 50 adjacent the die 40. Additional decoupling capacitors 7, which are referred to as bulk capacitors, are mounted on the PCB 20. Additional capacitance is provided by capacitance associated with the die 40 itself, which is referred to as on-die capacitance. The bulk capacitors 7 provide the low and mid-frequency decoupling, while the DSC's 30 and the on-die capacitance provide the high frequency decoupling.

Because it is preferable to minimize an inductive path 31 created between the DSC's 30 and the die 40, as illustrated in FIG. 3, it is known in the art to place the DSC's 30 as close to the die 40 as possible. In the case of a flip chip die, however, there are several limitations to the placement of the DSC's 30. For example, there is a minimum distance that must be maintained between the DSC's 30 and the die 40, since there is a substrate area surrounding the die 40 where the DSC's 30 cannot be placed. This problem is exemplified in FIG. 4, which shows a number of traces 115 that are routed through the substrate 50 to the flip chip die 40, and two DSC's 30 that are mounted on the substrate 50. Because the current from the DSC's 30 can distort the I/O signals carried by the traces 115 if the DSC's 30 are located too close to the traces 115, the DSCs 30 must be a sufficient distance from the die 40 to allow the traces 115 to be routed around the DSC's 30. Not only does this trace routing problem impact how close the DSC's 30 can be placed in relation to the die 40, it also impacts the number of DSC's 30 that can be placed on the substrate 50.

The placement and number of the DSC's 30 are also limited by the number of paths that the DSC's 30 can utilize to carry current to the die 40, since only a small set of planes 4 and vias 3 can be utilized to achieve the most efficient pathway, as shown in FIG. 3. In addition to these limitations, the size of the DSC's 30 are limited, since a heat spreader is often placed on top of the die 40, thus limiting the capacitor size to the height of the die 40.

BRIEF DESCRIPTION OF THE DRAWINGS

In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1:
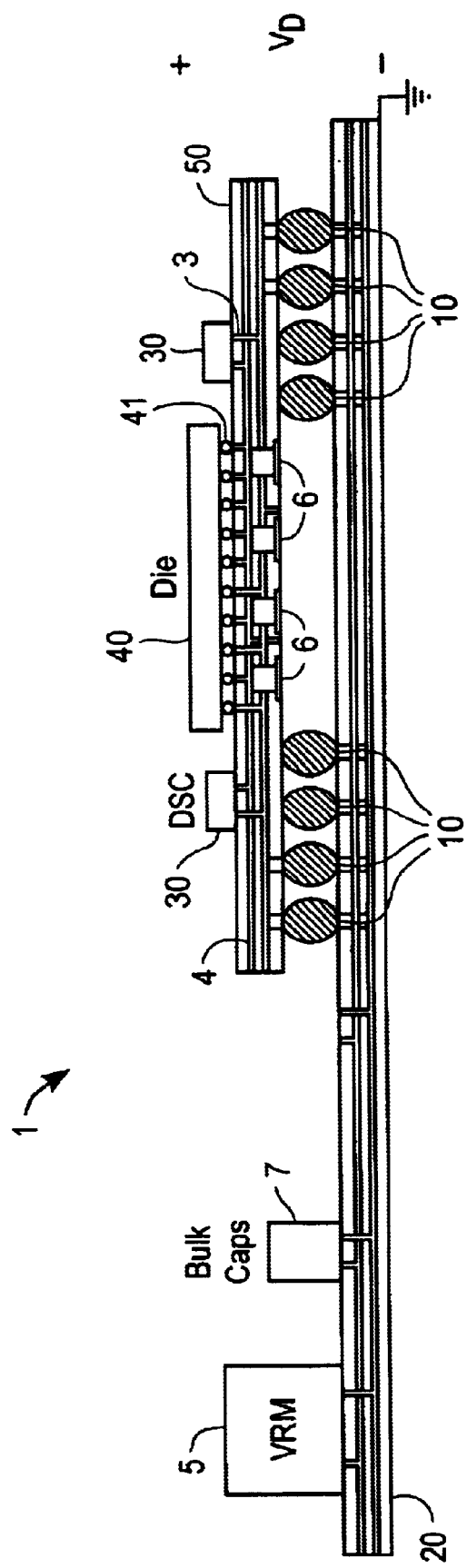
FIG. 1 is a cross-sectional view of a prior art electronic package assembly mounted to a printed circuit board.
Figure 5:
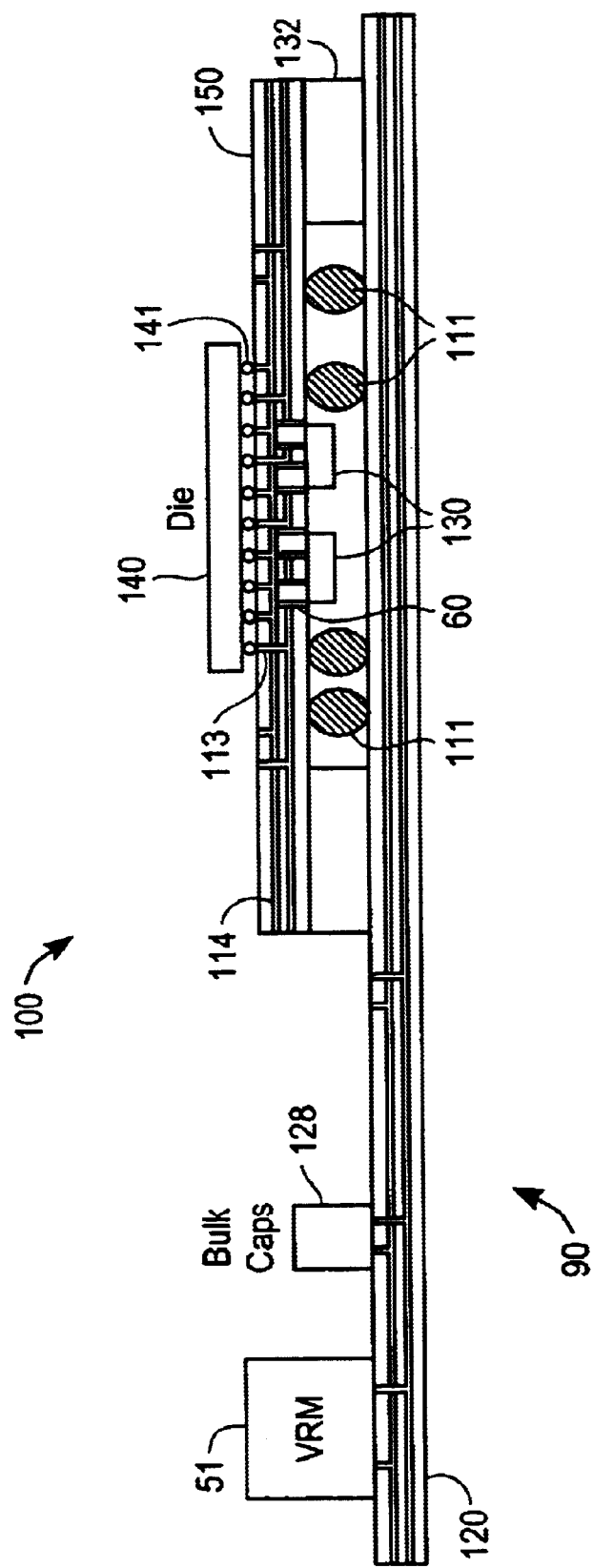
FIG. 5 is a cross-sectional view of a printed circuit board assembly constructed in accordance with a preferred embodiment of the present invention.

Referring to FIG. 5, a preferred embodiment of a printed circuit board assembly 90 comprises an electronic package assembly 100 and a printed circuit board (PCB) 120 on which the electronic package assembly 100 is suitably mounted via solder balls 111. The package assembly 100 generally comprises an integrated circuit (IC) die 140 (and specifically a flip-chip die) and a supporting substrate 150. In the illustrated embodiment, the flip-chip die 140 is mounted onto the substrate 150 via C4 solder balls 141, which serve as electrical connection elements, one of which is coupled to a power terminal on the flip-chip die 140. As with the prior art package assembly 1 illustrated in FIG. 1, a voltage regulator module (VRM) 51 supplies the power to the package assembly 100 through conductive pathways comprising vias 113, PTHs 60, and planes 114 formed in the substrate 150 and the PCB 120.

A plurality of discrete decoupling bulk capacitors 128 are suitably mounted on the printed circuit board 120, and are electrically coupled between the VRM 51 and the package assembly 100. Unlike the prior art package assembly 1, however, decoupling capacitors 130 are surface mounted underneath the substrate 150, rather than on top of the substrate 150 adjacent the die 141. These package capacitors 130 are referred to as land side capacitors (LSC's). In the illustrated embodiment, the decoupling capacitors are discrete components. Stand-offs 132 are also placed underneath the substrate 150. These stand-offs 132 can be made of, but not limited to, the same material typically used in a PCB 120. One such material known in the art is fiber reinforced plastic. The stand-offs 132 can optionally be routed with electrical conductors to provide another power delivery path from the PCB 120 to a power terminal of the die 140. With this embodiment, the current can travel from the VRM 51 through either the solder balls 111 or stand-offs 132 to the substrate 150.

There are several advantages gained by using package LSC's 130 in place of DSC's 30 to provide the high frequency decoupling. But, in order to illustrate these advantages, certain power delivery concepts should first be explained. As previously discussed with respect to FIG. 2, the change in the load current $I_{load}$ drawn by the die load $L_{die}$ disadvantageously causes a large drop in the voltage $V_{die}$ at the die load $L_{die}$.

Figure 7:
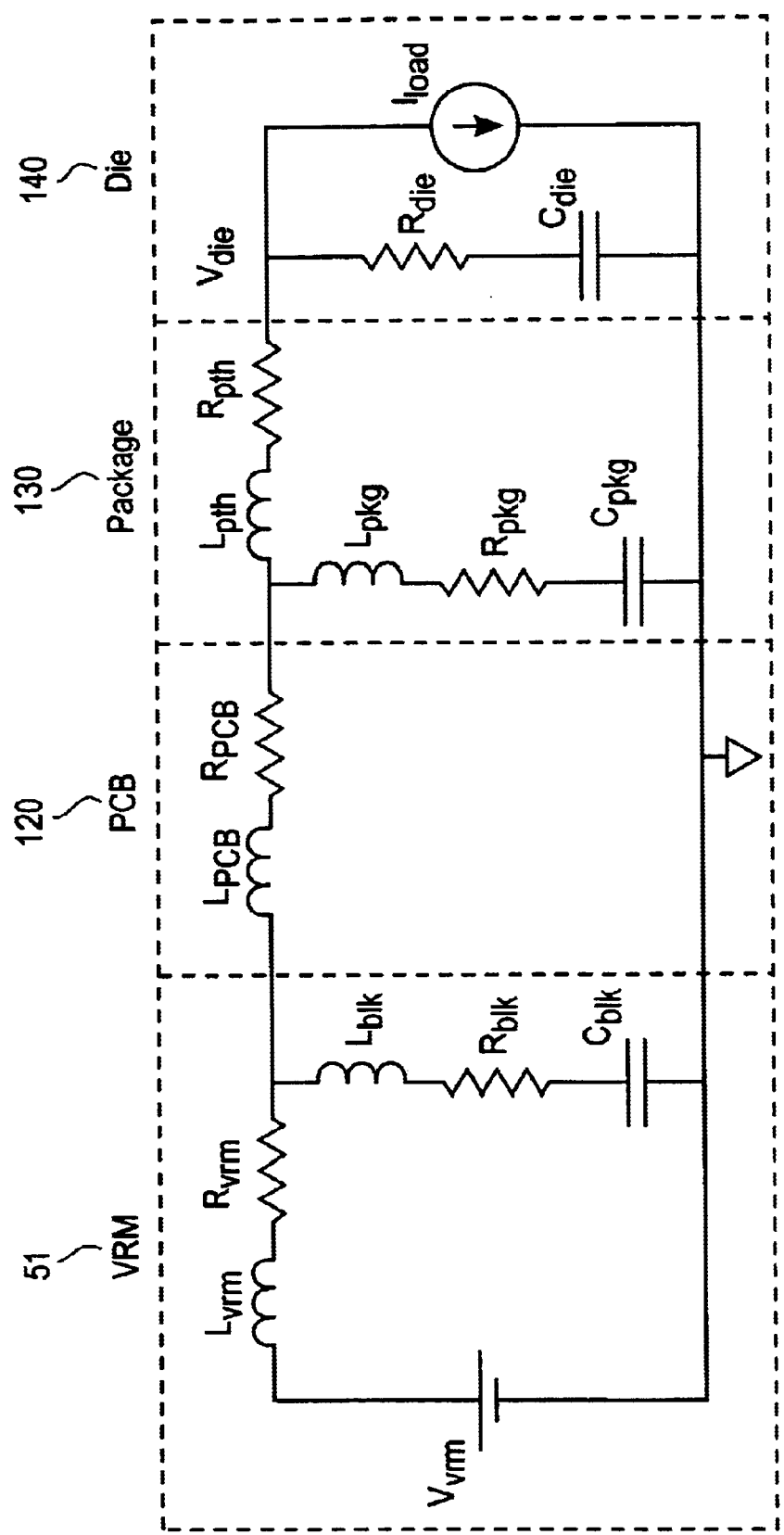
FIG. 7 is a basic power circuit diagram of the printed circuit board assembly of FIG. 5.

FIG. 7 shows a basic circuit diagram of the power delivery path between the VRM 51 and the package assembly 100. The VRM 51 has an associated voltage $V_{vrm}$, inductance $L_{vrm}$ and resistance $R_{vrm}$. The bulk capacitor 128 advantageously introduces capacitance $C_{blk}$ in parallel with the representative VRM components, but also introduces an associated inductance, $L_{blk}$ and resistance $R_{blk}$. In addition, the power delivery path from the PCB 120 to the package assembly 100 has an associated inductance $L_{PCB}$ and resistance $R_{PCB}$, and the power delivery path from the package capacitors 130 to the die 140 has an associated loop inductance $L_{pth}$ and resistance $R_{pth}$. The package capacitors 130 advantageously introduce an associated capacitance $C_{pkg}$, but also introduce an associated inductance $L_{pkg}$ and resistance, $R_{pkg}$. The die 140 itself introduces an associated resistance $R_{die}$ and capacitance $C_{die}$, and draws a current $I_{load}$ in response to core switching, such as when running a complex application or first turning on a computer.

Figure 8:
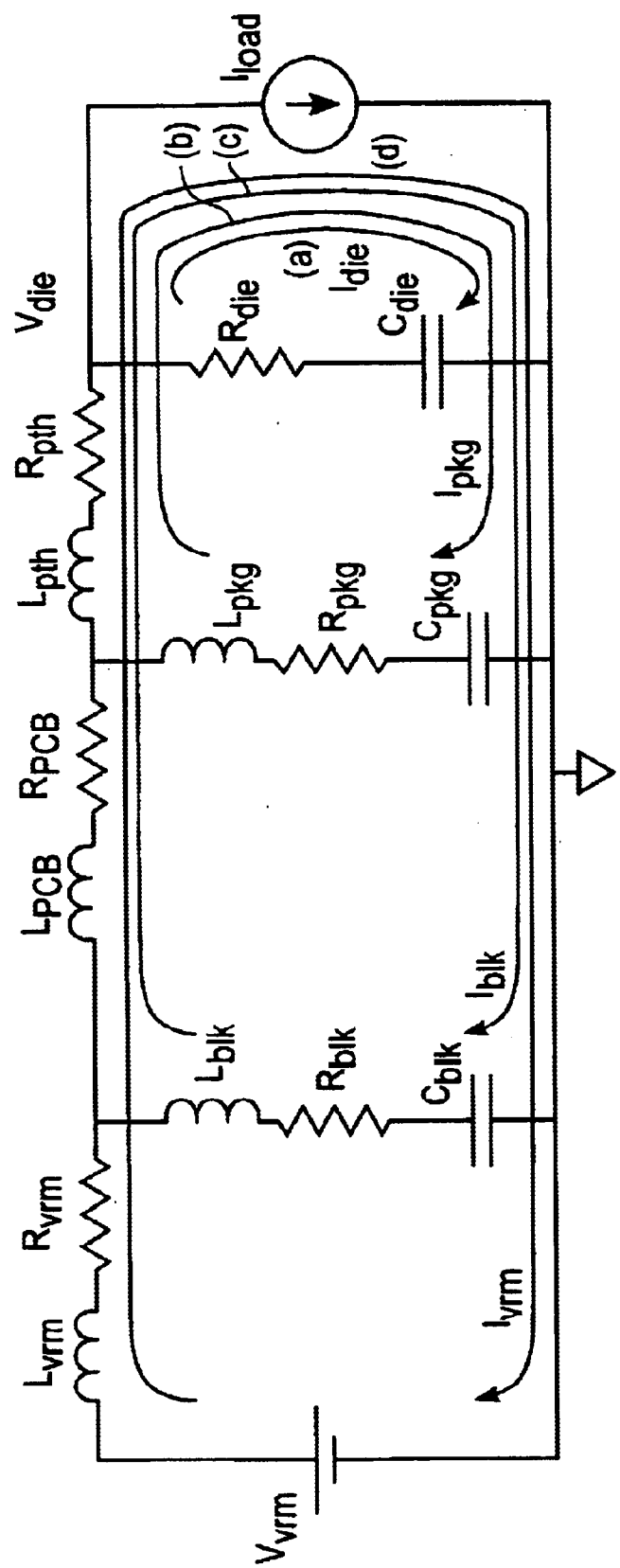
FIG. 8 is the basic power circuit diagram of FIG. 5 illustrating the various currents flowing therethrough.
Figure 9:
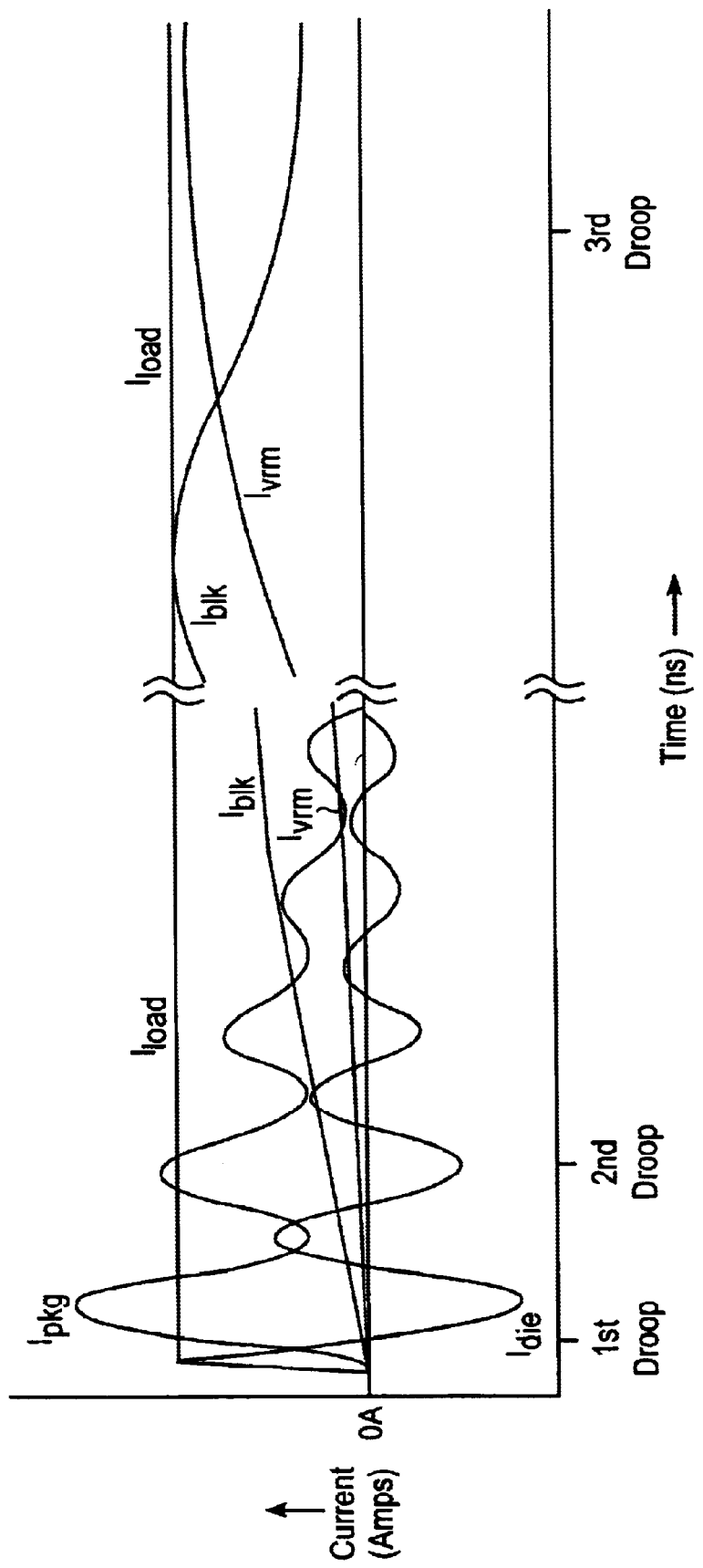
FIG. 9 is a computer simulation of the time domain waveforms of the various currents illustrated in the circuit diagram of FIG. 8.

Referring to FIGS. 8 and 9, the various currents that flow through the representative circuit of FIG. 7 are illustrated. Specifically, FIG. 8 is a circuit diagram that illustrates a supply current $I_{vrm}$, bulk capacitor current $I_{blk}$, package current $I_{pkg}$, and die current $I_{die}$ that contribute to the load current $I_{load}$ flowing through the load of FIG. 7. FIG. 9 illustrates the contribution of these currents to the load current $I_{load}$, as represented in the time domain.

When a dynamic event occurs at t=0 (e.g., core switching), the supply current $I_{vrm}$, bulk capacitor current $I_{blk}$, and package current $I_{pkg}$ drop to 0A, and the on-die capacitance $C_{die}$ provides a current surge through the on-die resistance $R_{die}$. At this point, the load current $I_{load}$ is represented entirely by the on-die current $I_{die}$. As the charge created by on-die capacitance $C_{die}$ depletes, the package capacitance $C_{pkg}$, bulk capacitance $C_{blk}$, and supply voltage $V_{vrm}$ contribute an increasing amount of current to the load current $I_{load}$, with the die current $I_{die}$ making the greatest contribution at the beginning of the dynamic event due to the more responsive high frequency on-die capacitance $C_{die}$. As the charge created by the package capacitance $C_{pkg}$ depletes, the bulk capacitor current $I_{blk}$ becomes the major contributor to the load current $I_{load}$. Then, as the charge created by the bulk capacitance $C_{pkg}$ depletes, the supply current $I_{vrm}$ itself becomes the major contributor to the load current $I_{load}$. As steady-state is reached, the load current $I_{load}$ will entirely be represented by the supply current $I_{vrm}$.

Figure 10:
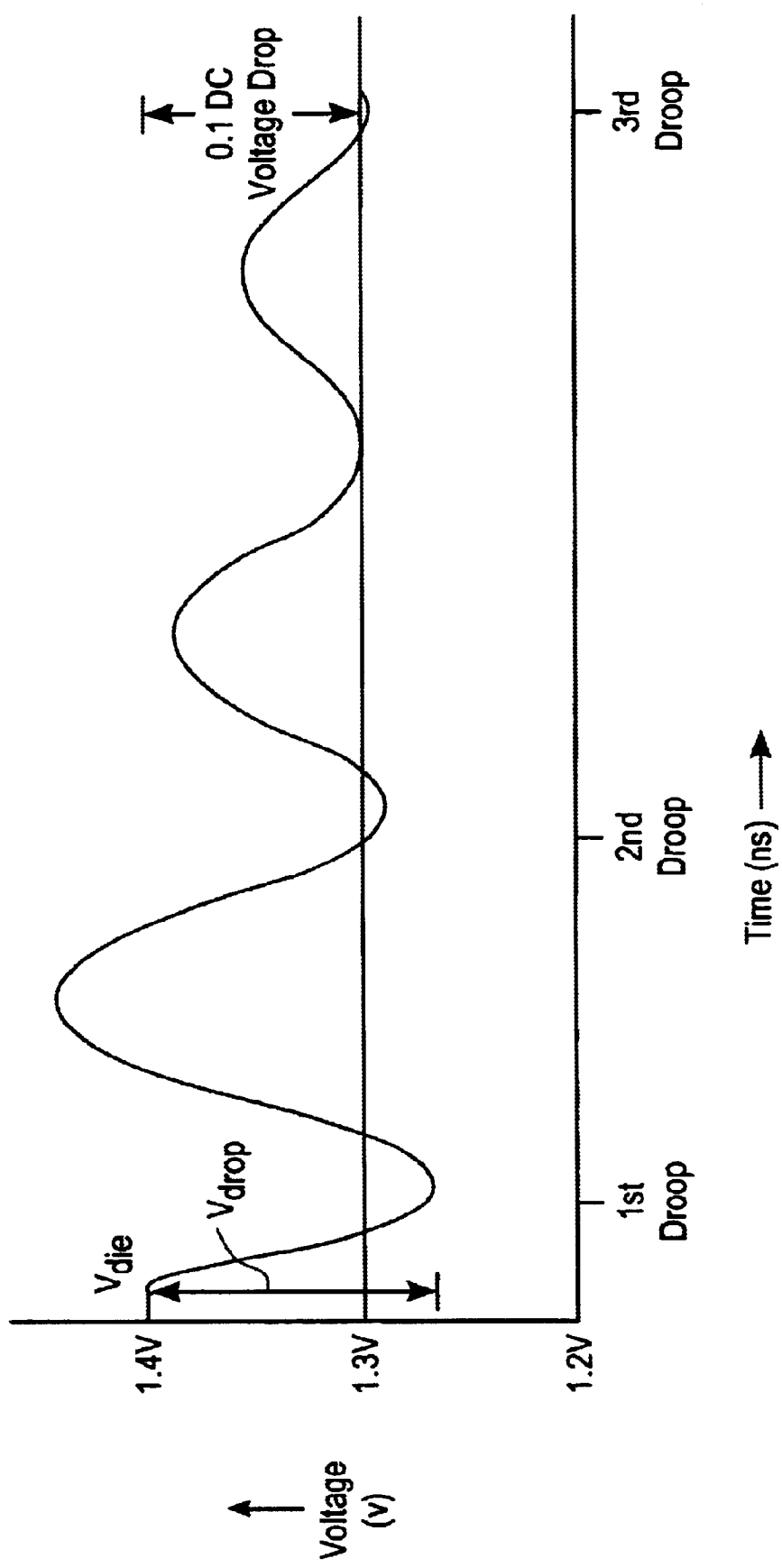
FIG. 10 is a computer simulation of the time domain waveform of the load voltage illustrated in the circuit diagram of FIG. 8 voltage waveforms.

A computer simulation of the corresponding voltage behavior in time domain is shown in FIG. 10, which measuring the die voltage $V_{die}$ during the current draw shown in FIG. 9. In this simulation, the VRM 51 supplies 1.4 V, but the overall impedance of the power delivery circuit causes a 0.1V DC voltage drop and creates AC noise. The AC performance of the circuit is measured in terms of this AC noise and is maximized during certain time instances referred to as "droops," and specifically $1^{st}$, $2^{nd}$, and $3^{rd}$ droops.

The $1^{st}$ droop is measured at the time the on-die current $I_{die}$ reaches 0A and the package current $I_{pkg}$ is providing the majority of the load current $I_{load}$. Thus, the $1^{st}$ droop depends on the behavior of the package capacitors 130. As explained above, there is a package inductance $L_{pkg}$ and a package resistance $R_{pkg}$ associated with the package capacitors 130. There is also an additional inductance $L_{pth}$ and resistance $R_{pth}$ associated with the current path, as shown in FIG. 8. The relationship between these elements may be mathematically depicted as:

$$(1^{st} \text{ droop}) \ V_{drop} = \frac{L_{pkg}}{N} \frac{dI_{pkg}}{dt} + I_{pkg} \frac{R_{pkg}}{N} + \frac{1}{N \cdot C_{pkg}} \int I_{pkg} dt + L_{pth} + R_{pth},$$

where N represents the number of identical capacitors placed in parallel.

Figure 11:
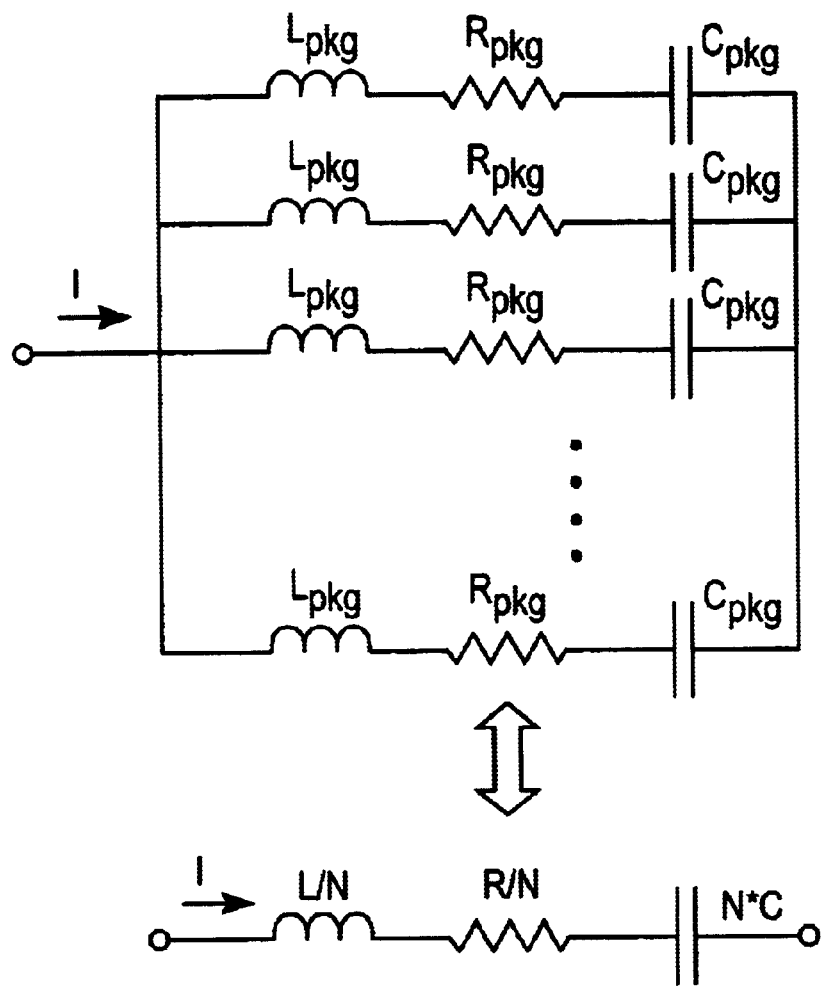
FIG. 11 is a basic circuit diagram of a parallel bank of package capacitors used in the printed circuit board assembly of FIG. 5.

Looking at the $1^{st}$ droop equation, it is evident that by placing a number N of identical capacitors in parallel, as illustrated in FIG. 11, the effect of the inductance associated with the package capacitor 130 $L_{pkg}$ is reduced, thereby lowering the voltage drop $V_{drop}$ at the $1^{st}$ droop.

Figure 2:
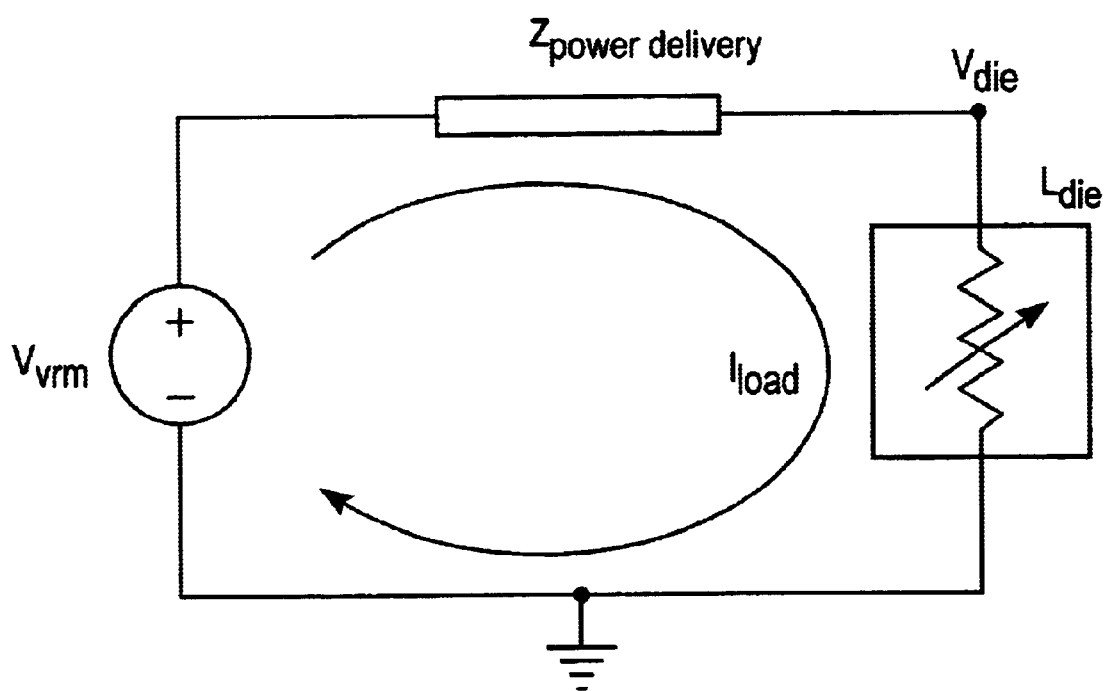
FIG. 2 is a basic power circuit diagram of the prior art electronic package of FIG. 1.
Figure 6:
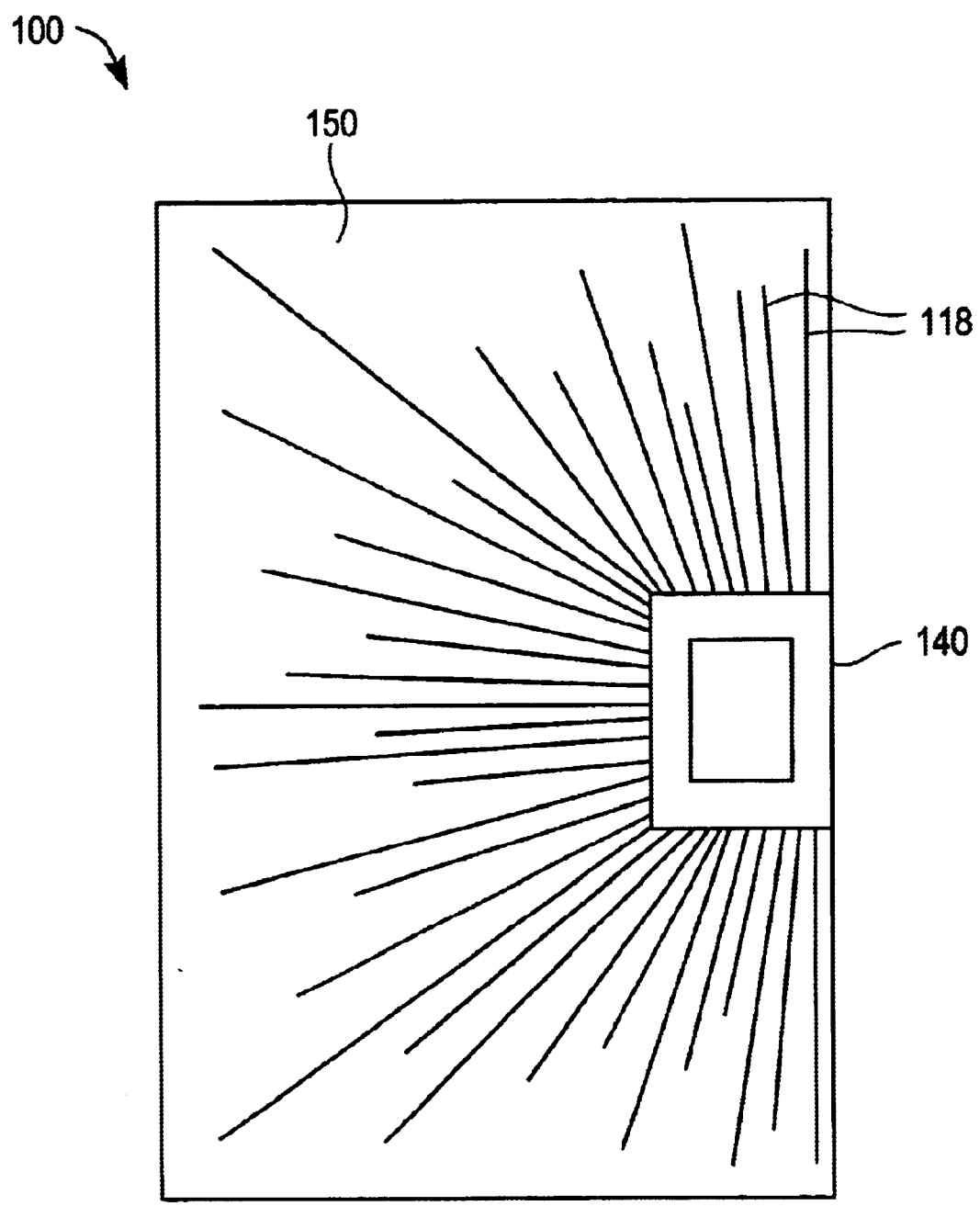
FIG. 6 is a partial plan view of an electronic package assembly used in the printed circuit board assembly of FIG. 5.

As previously mentioned with respect to FIG. 2, the number of DSC's 30 that can be placed on top of the substrate 50 is limited to avoid trace 115 routing problems. One advantage of using LSC's 130 is that by mounting the capacitors underneath the substrate 50, the capacitors will not affect the traces 118, as illustrated in FIG. 6. Thus, a greater number of capacitors can be used as LSC's 130. Also, the trace routings 118 are not compromised by LSC's 130 as they were with DSC's 30 in FIG. 4. Thus, the routing density and trace spacing are improved, since the need to route around DSC's 30 is eliminated.

Figure 4:
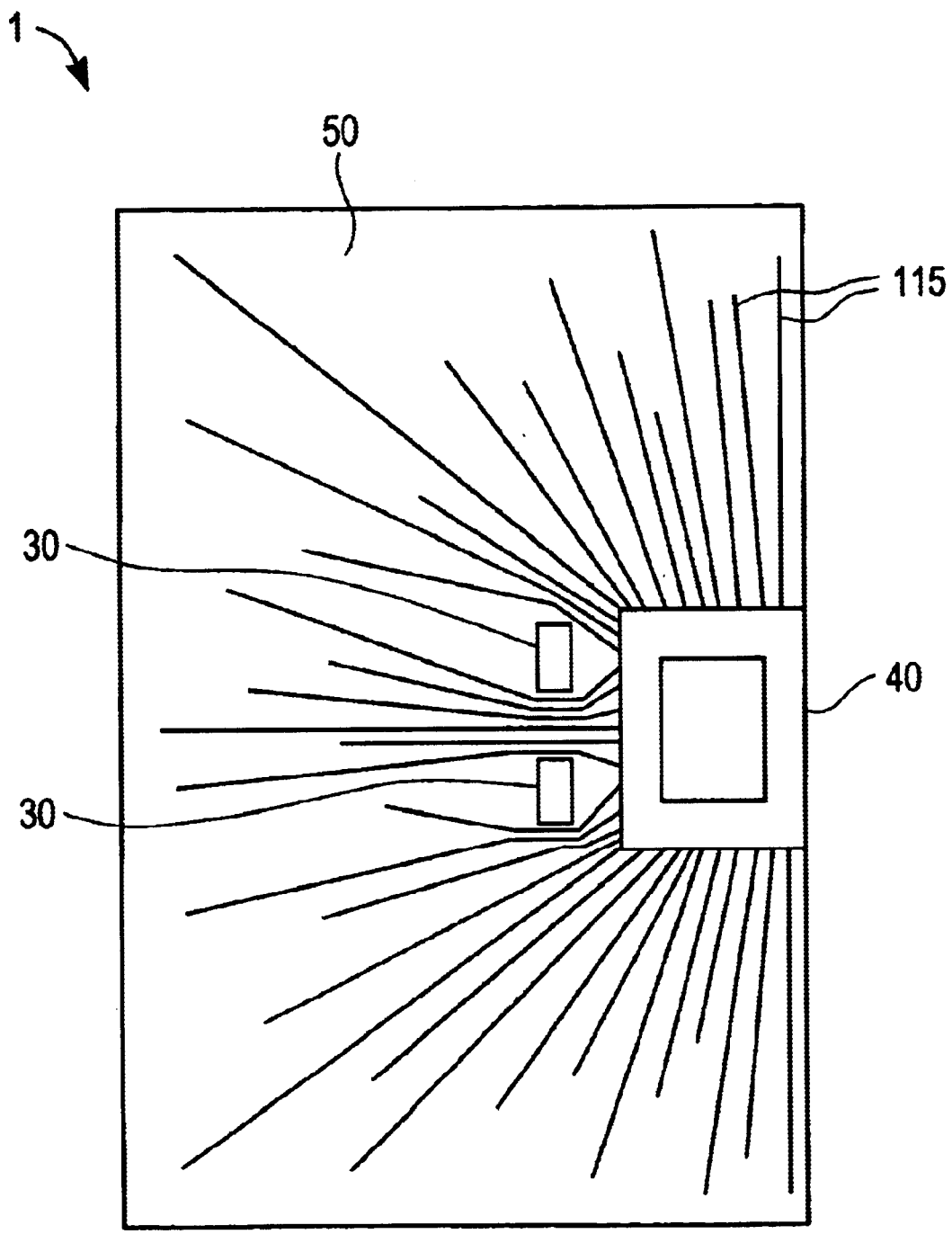
FIG. 4 is a partial plan view of the prior art electronic package assembly of FIG. 1.
Figure 14:
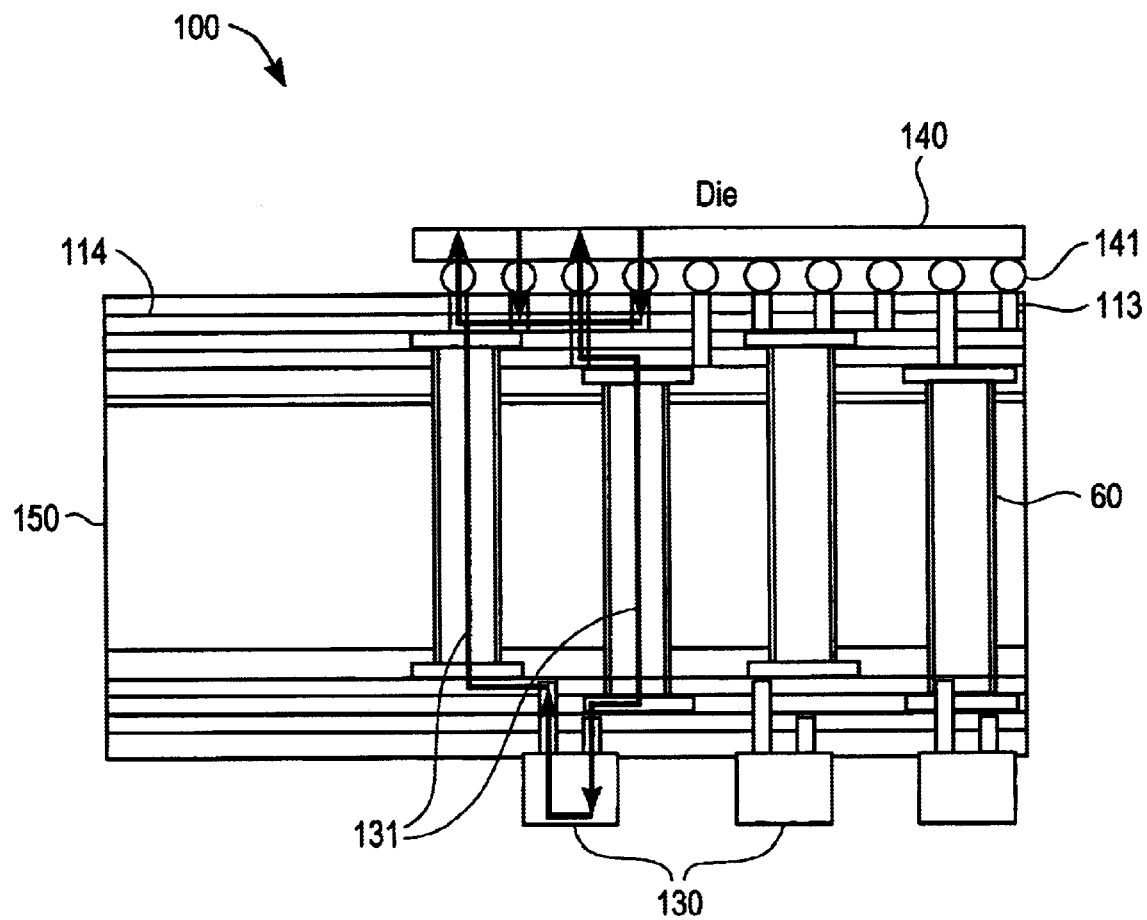
FIG. 14 is a cross-sectional view of an electronic package assembly used in the printed circuit board assembly of FIG. 5.

Referring to FIG. 14, another advantage of using LSC's 130 is the improved path 131 to the die 140. There are two improvements that are made to the path 131. The first is the distance from the LSC's 130 to the die 140. As explained above, DSC's 30 are also limited to how close they can reside next to the die 140, as shown in FIG. 4. LSC's 130 do not have that limitation, and therefore, can be placed right underneath the die 140. Thus, the distance between the LSC's 130 and the die 140 is limited only by the width of the substrate 150, and thus, the path 131 carrying the current between the LSCs 130 and the die 140 may be shorter. Referring to the $1^{st}$ droop equation, this shorter path 131 can reduce the loop inductance $L_{pth}$, thereby decreasing the voltage drop $V_{drop}$.

Figure 3:
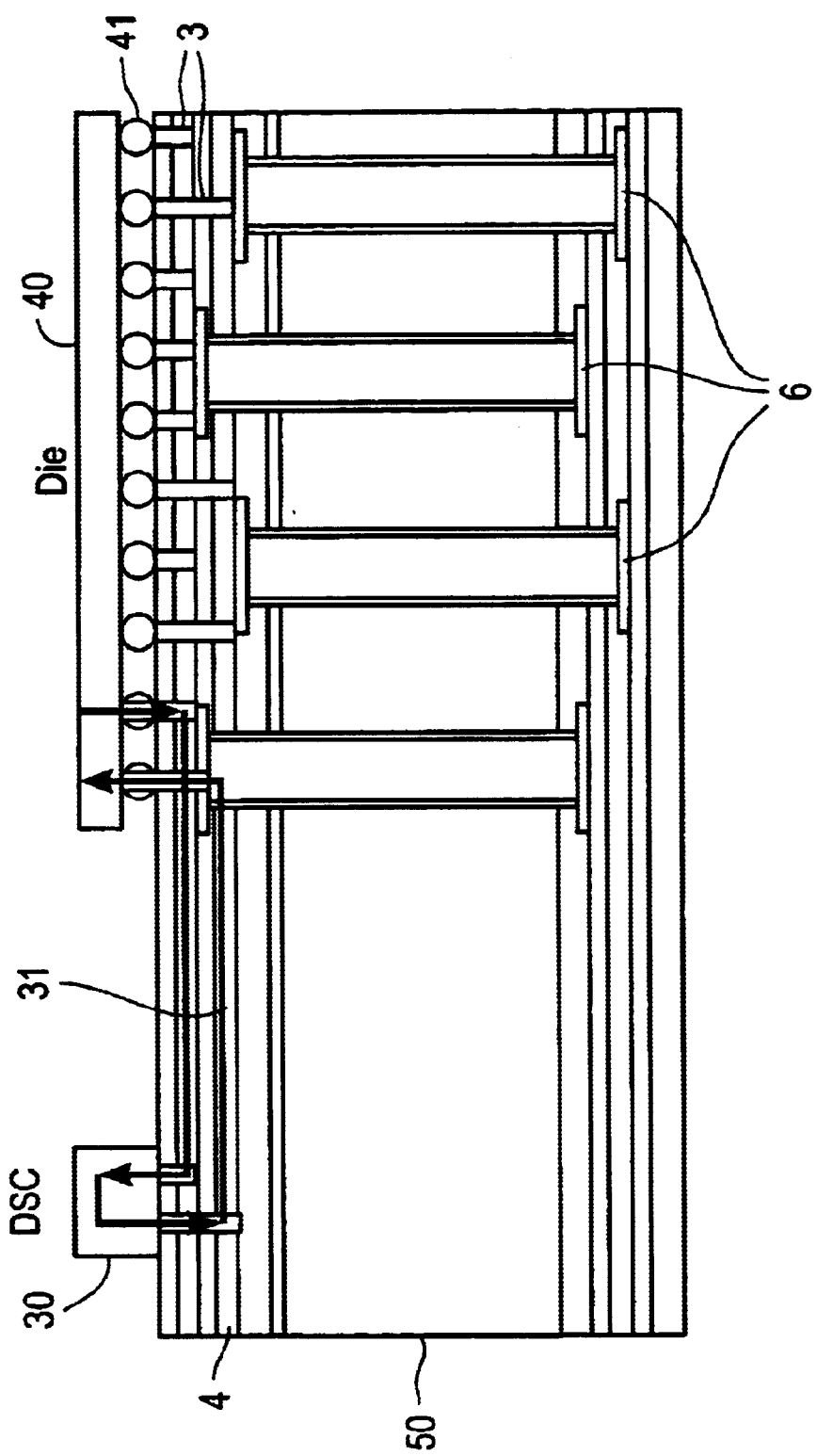
FIG. 3 is a cross-sectional view of the prior art electronic package assembly of FIG. 1.

The second improvement is an increase in the number of paths 131 that can be added from each LSC 130 to the die 140. Because the LSCs 130 can be placed underneath the substrate 150, the LSC's 130 can utilize the PTH's 60 and a larger number of vias 113 and planes 114 compared to DSC's 30 in FIG. 3. Thus, the number of paths 131 from the LSC's 130 to the die 140 can be increased, having the effect of increasing the number of capacitors in parallel. And, as shown in the $1^{st}$ droop equation, this will mitigate the effect of the package inductance $L_{pkg}$, thereby lowering the voltage drop $V_{drop}$.

Figure 12:
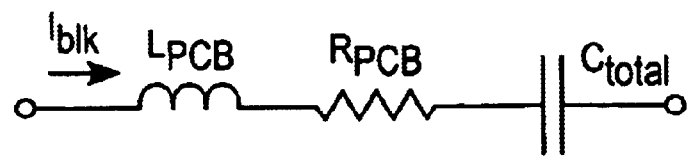
FIG. 12 is a basic circuit diagram of the total capacitance of the power delivery path within the printed circuit board assembly of FIG. 5.

Referring back to FIG. 9, the bulk capacitance $C_{blk}$ begins to take effect at the $2^{nd}$ droop. Thus, at this instance, both the package capacitors 130 and the bulk capacitors 128 supply the majority of the load current $I_{load}$. The computer simulation in FIG. 10 shows the voltage drop $V_{drop}$ at the $2^{nd}$ droop. Referring to FIG. 8, the $2^{nd}$ droop reflects the behavior of package and bulk capacitor currents $I_{pkg}$ and $I_{blk}$. At this instance, the voltage drop $V_{drop}$ is partially dependent upon the total capacitance of the power delivery circuit, $C_{total}$. Referring to FIG. 12, the voltage drop $V_{drop}$ during the $2^{nd}$ droop can be mathematically represented as:

$$(2^{nd} \text{ droop}) \ V_{drop} = L_{PCB} \frac{dI_{blk}}{dt} + I_{blk} R_{PCB} + \frac{1}{C_{total}} \int I_{blk} dt$$

In this equation, the values of the loop inductance $L_{PCB}$ and resistance $R_{PCB}$ of the path between the PCB 120 and the package assembly 100 are fixed. One method to reduce the effect of this inductance and resistance is to increase the size of the package capacitors 130, thus increasing the total capacitance $C_{total}$. The $2^{nd}$ droop equation shows that a larger total capacitance will lower the voltage drop $V_{drop}$.

Figure 15:
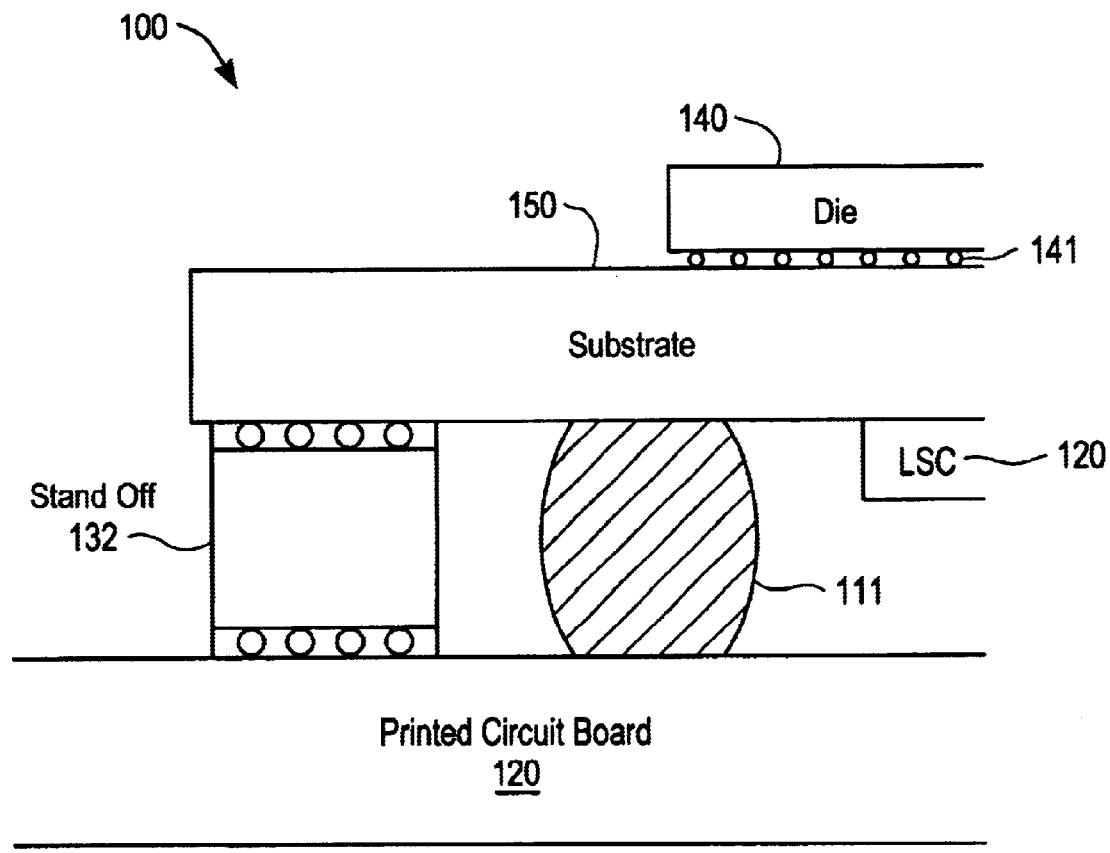
FIG. 15 is another cross-sectional view of the electronic package assembly of FIG. 14.

Given this, an advantage of using stand-offs 132 and LSC's 130 can be shown. Referring to FIG. 15, stand-offs 132 allow the package assembly 100 to sit higher on the PCB 120. This allows for a larger capacitor to fit in between the substrate 150 and PCB 120. As mentioned above, because it is sometimes preferable to place a heat spreader on top of the package assembly 100, the DSC 30 size is limited to the height of the die 30, but LSC's 130 do not have this limitation. Thus, having a larger capacitor as an LSC 130 can increase the total capacitance $C_{total}$, thereby lowering the voltage drop $V_{drop}$ at the $2^{nd}$ droop.

A "$3^{rd}$ droop" occurs when the supply current $I_{vrm}$ takes effect, at which time, the charge in the decoupling capacitors will have been depleted, thus having little effect on the voltage drop, $V_{drop}$.

Figure 13B:
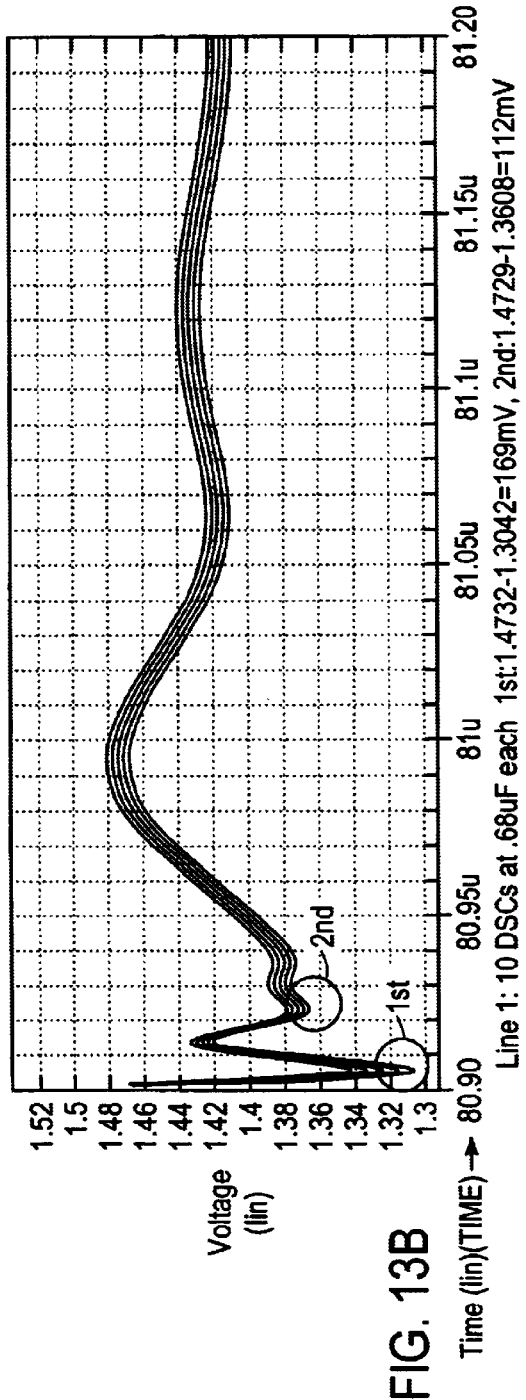
FIG. 13 is a table illustrating the results of voltage drops in various computer simulations of power delivery performance using various package capacitor configurations.
Figure 13C:
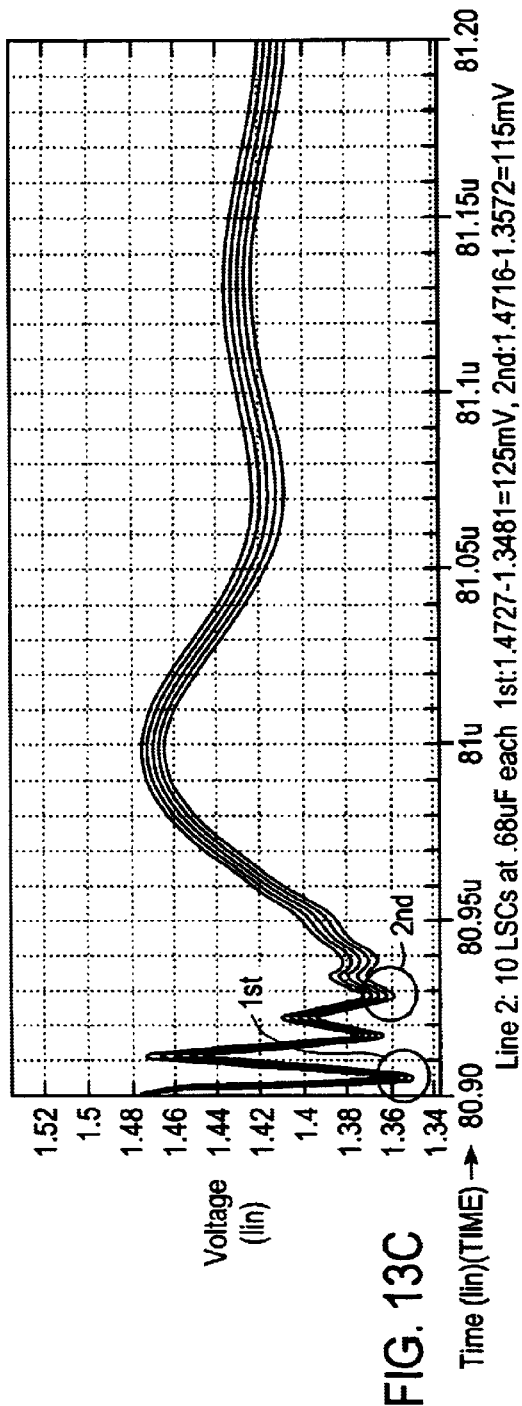
Figure 13D:
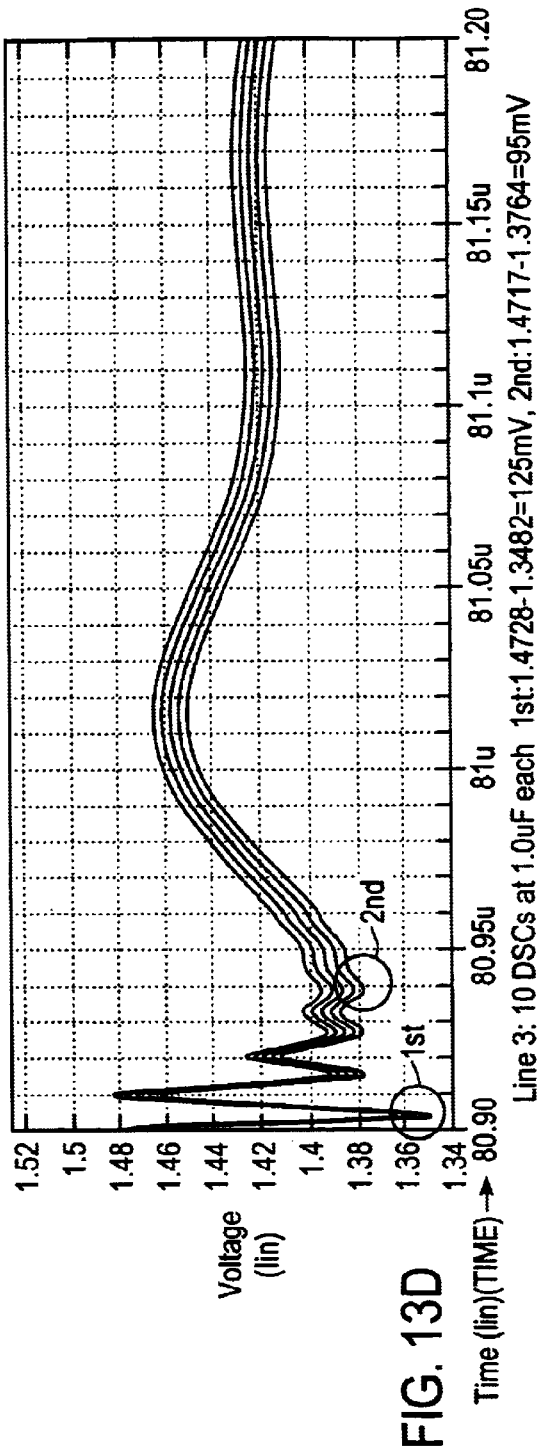

Referring to FIG. 13(a), the results of four computer simulations demonstrate the effects of various configurations of DSC's 30 and LSC's 130. FIGS. 13(b)–(e) illustrated the behavior of the voltage drop $V_{drop}$ in the time domain. Only the $1^{st}$ and $2^{nd}$ droops are shown, since the $3^{rd}$ droop occurs beyond the time domain shown and are not affected by the decoupling capacitors.

The first simulation uses ten DSC's 30, each with a capacitance of 0.68 uF. The second simulation uses the same size and number of capacitors as the first simulation, but as LSC's 130. The third simulation uses ten LSC's 130, each with a capacitance of 1.00 uF. And finally, the fourth simulation uses twenty-five LSC's 130, each with a capacitance of 1.50 uF. It should be noted that the solder ball height, i.e., the distance between the substrate 150 and the PCB 120, is less for the DSC 30 simulation compared to the LSC 130 simulations. The reason is that the package assembly 100 simulated with the LSC's 130 uses 1.1 mm stand-offs 132, forcing the substrate 150 to sit higher on the PCB 120. In contrast, the package assembly 1 simulated with the DSC's 30 does not have stand-offs 132, allowing the substrate 50 to sit lower on the PCB 20. Accordingly, in this simulation, the width of the solder balls 10 between the substrate 50 and DSC's 30 of the package assembly 1 is 0.65 mm, while the width the solder balls 111 between the substrate 150 and the LSC's 130 of the package assembly 100 is 0.52 mm.

The computer simulations demonstrate that the capacitors placed underneath the substrate 150 as LSC's 130, as compared to DSC's 30 of the same size, reduce the noise at the $1^{st}$ droop (in the case of a 0.68 $\mu$F capacitor) by 44 mV, while increasing the noise by 5 mV in the $2^{nd}$ droop. Compare the voltage behavior in FIG. 13(b), which illustrates the voltage drop $V_{drop}$ in the first scenario, with the voltage behavior in FIG. 13(c), which illustrates the voltage drop $V_{drop}$ in the second scenario. The reason for this reduced voltage at the $1^{st}$ droop is that the power delivery path from the LSC's 130 to the die 140 is improved. As explained above, the LSC's 130 can be placed closer to the die 140, and the number of paths from the LSC's 130 to the die 140 can be increased. Thus, the loop inductance $L_{pth}$ created by the path carrying the current from the package capacitor to the die, as illustrated in FIG. 8, is lower with LSC's 130, thus advantageously reducing its adverse affects on the $1^{st}$ droop.

In regards to the increase in the $2^{nd}$ droop, stand-offs 132 increase the solder ball 111 height, thus increasing the inductance $L_{PCB}$ and resistance $R_{PCB}$ of the current path between the PCB 120 and the package assembly 100, as illustrated in FIG. 8. This adversely affects the $2^{nd}$ voltage droop somewhat, but the benefits gained by using LSC's 130 generally outweigh this adverse result, as will be described below.

Referring back to the chart in FIG. 13(a), if we increase the capacitance in the LSC's 130 from 0.68 uF to 1.00 uF, the noise at the $1^{st}$ droop remains approximately the same as the 0.68 uF LSC's 130, but the $2^{nd}$ droop drops dramatically. The voltage behavior in the time domain is shown in FIG.

13(d). The reason for this can be shown by referring to the 2$^{nd}$ droop equation explained above. By increasing the LSC 130 capacitance, we increase the total capacitance C$_{total}$, thus lowering the voltage drop at the 2$^{nd}$ droop.

Figure 13E:
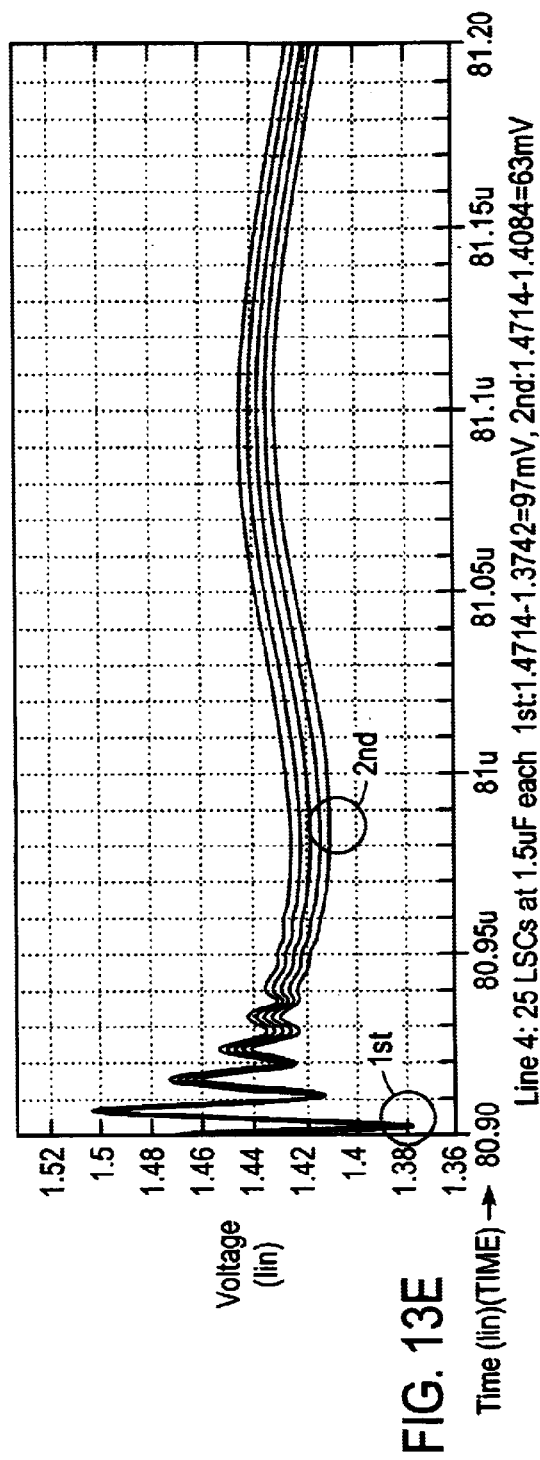

Referring to the last simulation on the chart in FIG. 13(a), if we increase the capacitance in the LSC's 130 to 1.50 uF and increase the number of capacitors to twenty five, the 1$^{st}$ and 2$^{nd}$ droops improve even more dramatically. This voltage behavior in the time domain is shown in FIG. 13(e). The reason for the 1$^{st}$ droop improvement can be shown by referring to the 1$^{st}$ droop equation explained above. As previously stated, a larger number of identical package capacitors 130 placed in parallel will reduce the effect of the package inductance L$_{pkg}$ and lower the voltage drop V$_{drop}$. As explained above, more LSC's 130 can be placed on the substrate than DSCs 30. By increasing the number N of LSC's 130 from ten to twenty-five, the 1$^{st}$ droop performance is improved. The reason for the improvement in the 2$^{nd}$ droop with 1.50 uF capacitors is the same as the reason for the improvement with 1.00 uF capacitors. The total capacitance increases, reducing the noise at the 2$^{nd}$ droop even further. As shown in FIG. 13(a), because the LSC's have depleted their current supply by the instance at the 3$^{rd}$ droop, the LSC's 130 will have little effect on this droop.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. Thus, the present inventions are intended to cover alternatives, modifications, and equivalents, which may be included within the spirit and scope of the present inventions as defined by the claims.

What is claimed is:

1. An electronic package assembly, comprising:
   a substrate having first and second opposing substrate surfaces;
   an integrated circuit die mounted on the first substrate surface;
   a capacitor mounted on the second substrate surface;
   an electrical connection element disposed on the second substrate surface; and
   a stand-off disposed on the second substrate surface, and being sized for maintaining a distance between the capacitor and another substrate and for allowing the electrical connection element to directly connect the second substrate surface to the other substrate when the stand-off is mounted to the other substrate.

2. The electronic package assembly of claim 1, wherein the capacitor is electrically coupled to the integrated circuit die.

3. The electronic package assembly of claim 2, wherein the capacitor is a power decoupling capacitor.

4. The electronic package assembly of claim 1, wherein the capacitor is a discrete capacitor.

5. The electronic package assembly of claim 1, wherein the stand-off is electrically coupled to the integrated circuit die.

6. The electronic package assembly of claim 1, wherein the stand-off is electrically coupled to a power terminal within the integrated circuit die.

7. The electronic package assembly of claim 1, wherein the electrical connection element comprises a solder ball.

8. The electronic package assembly of claim 1, wherein the integrated circuit die comprises a flip-chip.

9. The electronic package assembly of claim 1, further comprising:
   a plurality of capacitors disposed on the second substrate surface;
   a plurality of electrical connection elements disposed on the second substrate surface; and
   a plurality of stand-offs disposed on the second substrate surface, each being sized for maintaining a distance between the capacitor and another substrate and for allowing the electrical connection elements to directly connect the second substrate surface to the other substrate when the stand-offs are mounted to the other substrate.

10. An electronic package assembly, comprising:
    a substrate having first and second opposing substrate surfaces;
    an integrated circuit die disposed on the first substrate surface;
    an electrical component disposed on the second substrate surface;
    an electrical connection element disposed on the second substrate surface; and
    a stand-off disposed on the second substrate surface, being sized for maintaining a distance between the electrical component and another substrate and for allowing the electrical connection element to directly connect the second substrate surface to the other substrate when the stand-off is mounted to the other substrate.

11. The electronic package assembly of claim 10, wherein the electrical component is electrically coupled to the integrated circuit die.

12. The electronic package assembly of claim 10, wherein the electrical component is a discrete component.

13. The electronic package assembly of claim 10, wherein the stand-off is electrically coupled to the integrated circuit die.

14. The electronic package assembly of claim 10, wherein the stand-off is electrically coupled to a power terminal within the integrated circuit die.

15. The electronic package assembly of claim 10, wherein the electrical connection element comprises a solder ball.

16. The electronic package assembly of claim 10, wherein the integrated circuit die comprises a flip-chip.

17. The electronic package assembly of claim 10, further comprising:
    a plurality of electrical components disposed on the second substrate surface; and
    a plurality of stand-offs disposed on the second substrate surface, being sized to maintain a distance between the plurality of electrical components and another substrate when the plurality of stand-offs is mounted to the other substrate and to allow the electrical connections to directly connect the second substrate surface to the other substrate when the stand-offs are mounted to the other substrate.

18. A printed circuit board assembly, comprising:
    a printed circuit board;
    a substrate having first and second opposing substrate surfaces;
    an integrated circuit die disposed on the first substrate surface;
    a capacitor disposed on the second substrate surface; and
    an electrical connection element directly connecting the second substrate surface to the printed circuit board.

19. The printed circuit board assembly of claim 18, further comprising a stand-off disposed between the second substrate surface and the printed circuit board, wherein the capacitor is maintained a distance from the printed circuit board.

20. The printed circuit board assembly of claim 19, wherein the stand-off is electrically coupled to the integrated circuit die.

21. The printed circuit board assembly of claim 18, wherein the capacitor is electrically coupled to the integrated circuit die.

22. The printed circuit board assembly of claim 18, wherein the capacitor is a power decoupling capacitor.

23. The printed circuit board assembly of claim 18, wherein the capacitor is a discrete capacitor.

24. The printed circuit board assembly of claim 18, further comprising a power supply electrically coupled to the integrated circuit die.

25. The printed circuit board assembly of claim 18, wherein the electrical connection comprises a solder ball.

26. The printed circuit board assembly of claim 18, wherein the integrated circuit die comprises a flip-chip.

27. The printed circuit board assembly of claim 18, further comprising a plurality of capacitors disposed on the second substrate surface.

28. The printed circuit board assembly of claim 18, further comprising a plurality of electrical connection elements directly connecting the second substrate surface to the printed circuit board.

29. The printed circuit board assembly of claim 18, further comprising a plurality of stand-offs disposed between the second substrate surface and the printed circuit board.

* * * * *